United States Patent
Furuhashi et al.

(10) Patent No.: US 9,627,402 B2
(45) Date of Patent: Apr. 18, 2017

(54) SEMICONDUCTOR MEMORY DEVICE AND METHOD FOR MANUFACTURING THE SAME

(71) Applicant: KABUSHIKI KAISHA TOSHIBA, Tokyo (JP)

(72) Inventors: Takashi Furuhashi, Mie (JP); Masayuki Tanaka, Mie (JP); Kenichiro Toratani, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/749,830

(22) Filed: Jun. 25, 2015

(65) Prior Publication Data

US 2016/0233230 A1 Aug. 11, 2016

Related U.S. Application Data

(60) Provisional application No. 62/114,845, filed on Feb. 11, 2015.

(51) Int. Cl.
| | |
|---|---|
| *H01L 29/792* | (2006.01) |
| *H01L 27/11582* | (2017.01) |
| *H01L 29/423* | (2006.01) |
| *H01L 27/1157* | (2017.01) |

(52) U.S. Cl.
CPC .... *H01L 27/11582* (2013.01); *H01L 27/1157* (2013.01); *H01L 29/4234* (2013.01)

(58) Field of Classification Search
CPC ........................ H01L 27/11582; H01L 29/4234
USPC ........................................................ 257/324
See application file for complete search history.

(56) References Cited

U.S. PATENT DOCUMENTS

| | | | |
|---|---|---|---|
| 5,907,188 A | 5/1999 | Nakajima et al. | |
| 8,115,249 B2 | 2/2012 | Kamioka et al. | |
| 2010/0163968 A1* | 7/2010 | Kim ................... | H01L 27/11582 257/324 |
| 2014/0061770 A1* | 3/2014 | Lee ................... | H01L 29/66825 257/324 |

(Continued)

FOREIGN PATENT DOCUMENTS

| | | |
|---|---|---|
| JP | 09-050973 | 2/1997 |
| JP | 2009-277961 | 11/2009 |

*Primary Examiner* — David Vu
*Assistant Examiner* — Brandon Fox
(74) *Attorney, Agent, or Firm* — Finnegan, Henderson, Farabow, Garrett & Dunner LLP

(57) ABSTRACT

A semiconductor memory device according to an embodiment, includes a stacked body, a semiconductor member, a charge storage layer, a charge block layer and an electrode antioxidant layer. The stacked body includes a plurality of electrode layers stacked separated from each other and an inter-electrode insulating layer between the electrode layers. The semiconductor member extends in a stacking direction of the stacked body and penetrates the stacked body. The tunnel insulating layer is provided on a side surface of the semiconductor member. The charge storage layer is provided on a side surface of the tunnel insulating layer. The charge block layer is provided on a side surface of the charge storage layer and contains oxygen. The electrode antioxidant layer is provided between the charge block layer and the electrode layer and has a composition different from that of the electrode layer.

9 Claims, 10 Drawing Sheets

(56) References Cited

U.S. PATENT DOCUMENTS

2014/0353738 A1* 12/2014 Makala ............. H01L 27/11551
  257/321
2015/0200112 A1* 7/2015 Han ................. H01L 21/32133
  438/478
2016/0211272 A1* 7/2016 Koka ................ H01L 27/11582

* cited by examiner

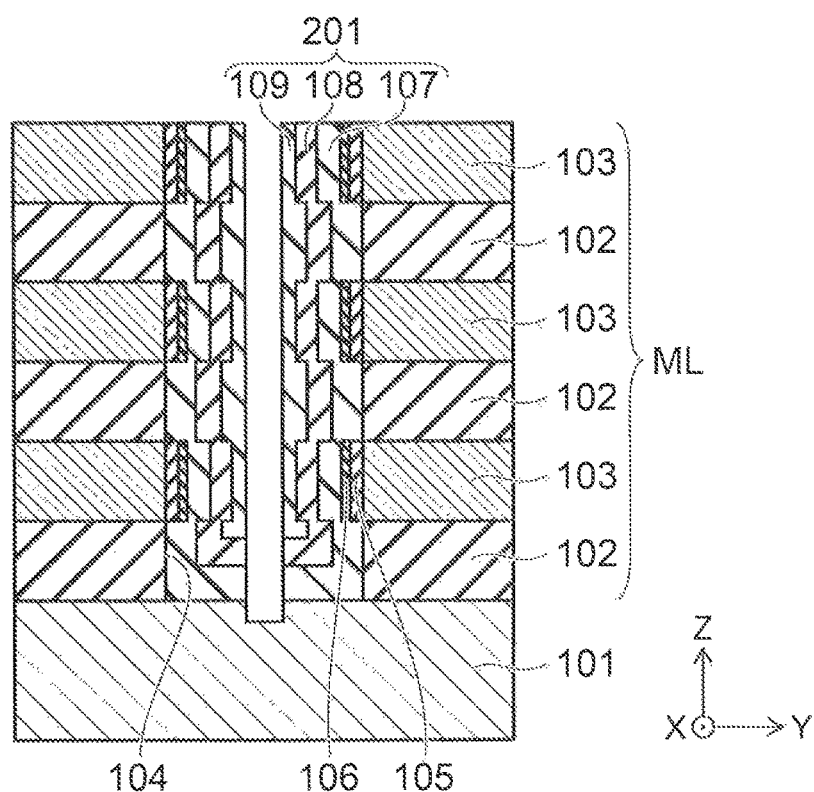
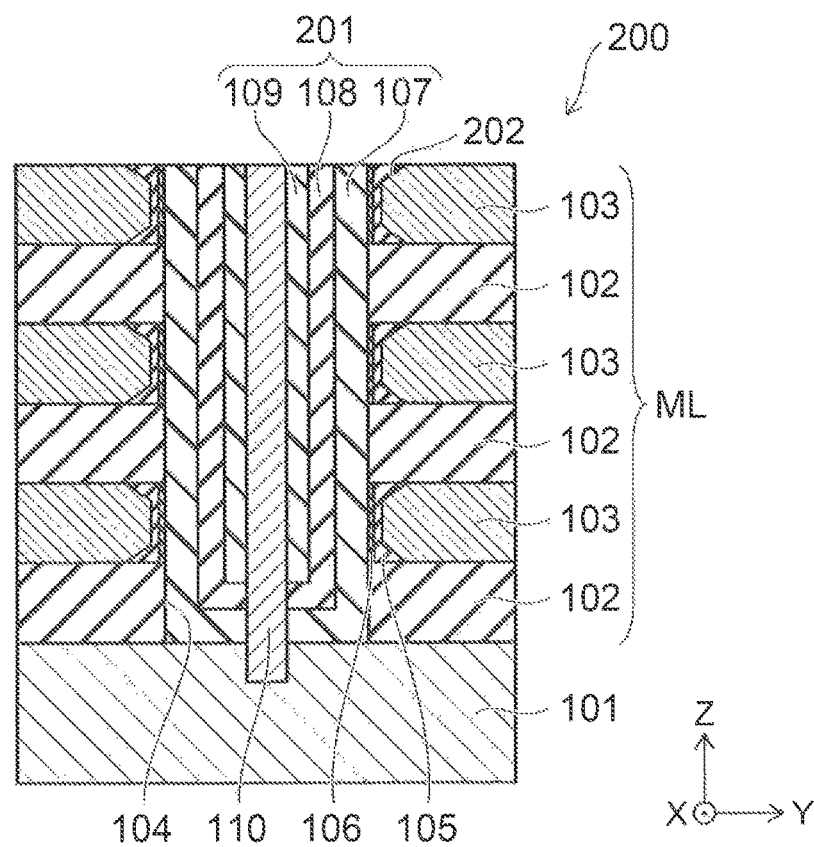

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/114,845, filed on Feb. 11, 2015; the entire contents of which are incorporated herein by reference.

FIELD

Embodiments described herein relate generally to a semiconductor memory device and a method for manufacturing the same.

BACKGROUND

In recent years, a three-dimensionally stacked semiconductor memory device capable of increasing its storage capacity while suppressing an increase in bit cost has been proposed. Such a three-dimensionally stacked semiconductor memory device includes a stacked body in which electrode layers and inter-electrode insulating layers are alternately stacked. Conventionally, after a hole is formed in the stacked body, a portion of the electrode layer exposed in an inner surface of the hole is sometimes oxidized. When the electrode layer with a low resistance is oxidized, the resistance of the electrode layer is increased, constituting a factor in deterioration of charge retention characteristics or memory characteristics such as erasing/writing characteristics.

BRIEF DESCRIPTION OF THE DRAWINGS

FIG. 3 to FIG. 9 are process cross-sectional views illustrating a method for manufacturing the semiconductor device according to the first embodiment, showing a region corresponding to the portion A shown in FIG. 1;

FIG. 10 is a cross-sectional view illustrating a semiconductor memory device according to a second embodiment, showing a region corresponding to the portion A in FIG. 1;

DETAILED DESCRIPTION

A semiconductor memory device according to an embodiment, includes a stacked body, a semiconductor member, a charge storage layer, a charge block layer and an electrode antioxidant layer. The stacked body includes a plurality of electrode layers stacked separated from each other and an inter-electrode insulating layer between the electrode layers. The semiconductor member extends in a stacking direction of the stacked body and penetrates the stacked body. The tunnel insulating layer is provided on a side surface of the semiconductor member. The charge storage layer is provided on a side surface of the tunnel insulating layer. The charge block layer is provided on a side surface of the charge storage layer and contains oxygen. The electrode antioxidant layer is provided between the charge block layer and the electrode layer and has a composition different from that of the electrode layer.

Hereinafter, embodiments of the invention will be described with reference to the drawings.

First Embodiment

First, a first embodiment will be described.

Figure 1:
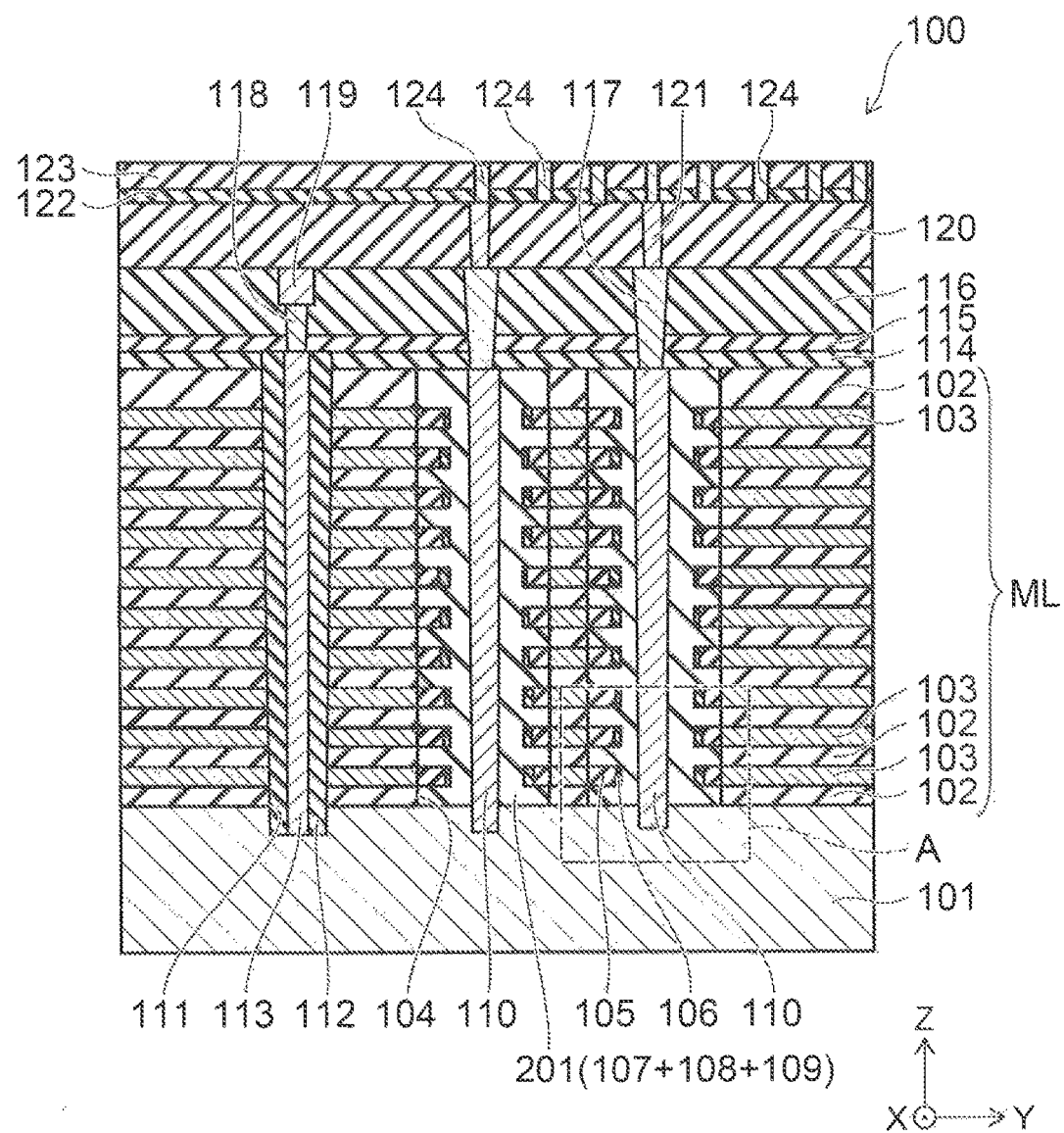
FIG. 1 is a cross-sectional view illustrating a semiconductor memory device according to a first embodiment.

FIG. 1 is a cross-sectional view illustrating a semiconductor memory device according to the embodiment.

As shown in FIG. 1, the semiconductor memory device 100 according to the embodiment is provided with a silicon substrate 101.

On the silicon substrate 101, inter-electrode insulating layers 102 and electrode layers 103 are alternately stacked to form a stacked body ML.

The inter-electrode insulating layer 102 is formed of, for example, an insulating material such as silicon oxide, and the electrode layer 103 is formed of, for example, a low-resistance metal such as tungsten (W) or molybdenum (Mo), or a metal silicide such as nickel silicide.

Hereinafter, an XYZ orthogonal coordinate system is employed for convenience of description in the specification. In the coordinate system, two directions parallel to a major surface of the silicon substrate 101 and orthogonal to each other are defined as an X-direction and a Y-direction, and a direction orthogonal to both the X-direction and the Y-direction, that is, a stacking direction of the stacked body ML is defined as a Z-direction.

Memory holes 104 each of which penetrates the inter-electrode insulating layers 102 and the electrode layers 103 in the Z-direction are formed in the stacked body ML. The memory hole 104 reaches an upper surface of the silicon substrate 101.

In the memory hole 104, an electrode antioxidant layer 105 is provided on a side surface of the electrode layer 103. On a side surface of the electrode antioxidant layer 105, which is not in contact with the electrode layer 103, an oxide layer 106 is provided. Further, a memory film 201 is provided so as to cover an entire inner surface of the memory hole 104. The memory film 201 is in contact with the electrode antioxidant layer 105, the oxide layer 106, and the silicon substrate 101.

The electrode antioxidant layer 105 is formed of a material that is turned into a high dielectric constant metal oxide through oxidation, and is formed of one or more kinds of materials selected from the group consisted of, for example, hafnium, zirconium, aluminum, hafnium nitride, zirconium nitride, aluminum nitride, hafnium carbide, zirconium carbide, and aluminum carbide. The high dielectric constant metal oxide is a metal oxide having a higher is dielectric constant than silicon oxide (SiO$_2$). The oxide layer 106 is formed by oxidizing a portion of the electrode antioxidant layer 105.

A silicon pillar 110 is embedded in the memory hole 104. The silicon pillar 110 is in contact with the silicon substrate 101. The silicon pillar 110 is provided at a position including a central axis of the memory hole 104.

An insulating layer 114 is provided on the stacked body ML. A slit 111 that penetrates the insulating layer 114 and the stacked body ML is formed. An insulating layer 112 is provided on a side surface of the slit 111. A conductive member 113 is embedded within the slit 111.

An insulating layer 115 is provided on the insulating layer 114, and an insulating layer 116 is provided on the insulating layer 115.

A plug 117 that penetrates the insulating layers 116, 115, and 114 is provided in a region directly on the silicon pillar 110. The plug 117 is in contact with the silicon pillar 110.

A plug 118 that penetrates a lower layer portion of the insulating layer 116 and the insulating layer 115 is provided in a region directly on the conductive member 113. A source line 119 that extends in the X-direction is provided in a region directly on the plug 118. A lower end of the plug 118 is in contact with the conductive member 113, and an upper end of the plug 118 is in contact with the source line 119.

An insulating layer 120 is provided on the insulating layer 116. A plug 121 that penetrates the insulating layer 120 is provided in a region directly on the plug 117. The plug 121 is connected to the plug 117.

A bit line 124 that extends in the X-direction is provided in a region directly on the plug 121, and the plug 121 is in contact with the bit line 124. An insulating layer 122 is provided on the insulating layer 120, and an insulating layer 123 is provided on the insulating layer 122.

Next, a configuration around the memory hole 104 will be described.

Figure 2:
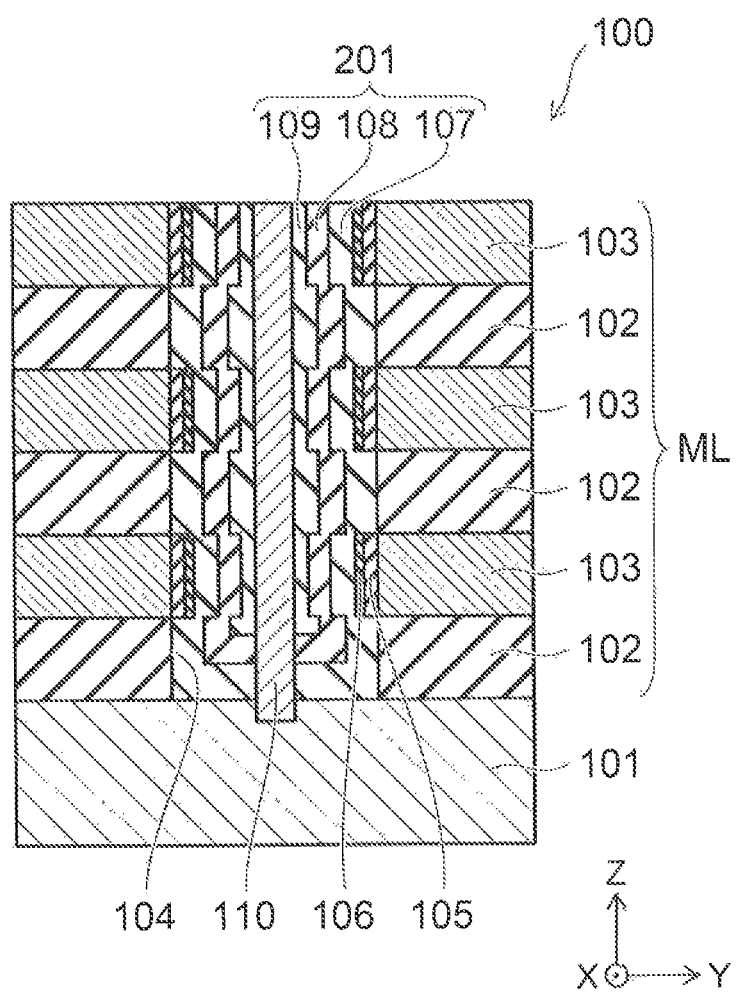
FIG. 2 is an enlarged view of a portion A of the semiconductor memory device according to the first embodiment shown in FIG. 1.

FIG. 2 is an enlarged view of a portion A of the semiconductor memory device according to the embodiment shown in FIG. 1.

As shown in FIG. 2, the memory film 201 is formed by stacking a charge block layer 107, a charge storage layer 108, and a tunnel insulating layer 109 in this order as viewed from a side surface of the memory hole 104. The charge block layer 107 is a layer that does not substantially allow a current to flow therethrough even with the application of a voltage within the range of drive voltage of the semiconductor memory device 100. The charge storage layer 108 is a layer having the ability to store charge. The tunnel insulating layer 109 is a layer that is usually insulating but allows a tunnel current to flow therethrough in response to the application of a predetermined voltage within the range of drive voltage of the semiconductor memory device 100.

The electrode antioxidant layer 105 is provided on the side surface of the electrode layer 103 in the memory hole 104. A portion of the electrode antioxidant layer 105 including a side surface thereof is partially oxidized and turned into the oxide layer 106. For example, a side surface of the electrode antioxidant layer 105 on the central axis side of the memory hole 104 is oxidized and turned into the oxide layer 106. The charge block layer 107 is provided in the memory hole 104. The charge block layer 107 is in contact with the inter-electrode insulating layer 102, the electrode antioxidant layer 105, the oxide layer 106, and the silicon substrate 101. Further, the tunnel insulating layer 109 is provided on the charge storage layer 108.

The charge block layer 107 is formed of a material containing a high dielectric constant metal oxide. The charge storage layer 108 is formed of a material containing silicon nitride. The tunnel insulating layer 109 is formed of a material containing silicon oxide.

Portions of the charge block layer 107 and the charge storage layer 108, which cover the electrode antioxidant layer 105, project toward the central axis of the memory hole 104. With this configuration, the charge block layer 107 and the charge storage layer 108 are disposed in a bellows shape as viewed from the X-direction. The silicon pillar 110 is provided at the position including the central axis of the memory hole 104. The silicon pillar 110 is in contact with the upper surface of the silicon substrate 101.

Next, a method for manufacturing the semiconductor memory device 100 according to the embodiment will be described.

FIG. 3 to FIG. 9 are process cross-sectional views illustrating the method for manufacturing the semiconductor memory device according to the first embodiment, showing a region corresponding to the portion A shown in FIG. 1.

Figure 3:
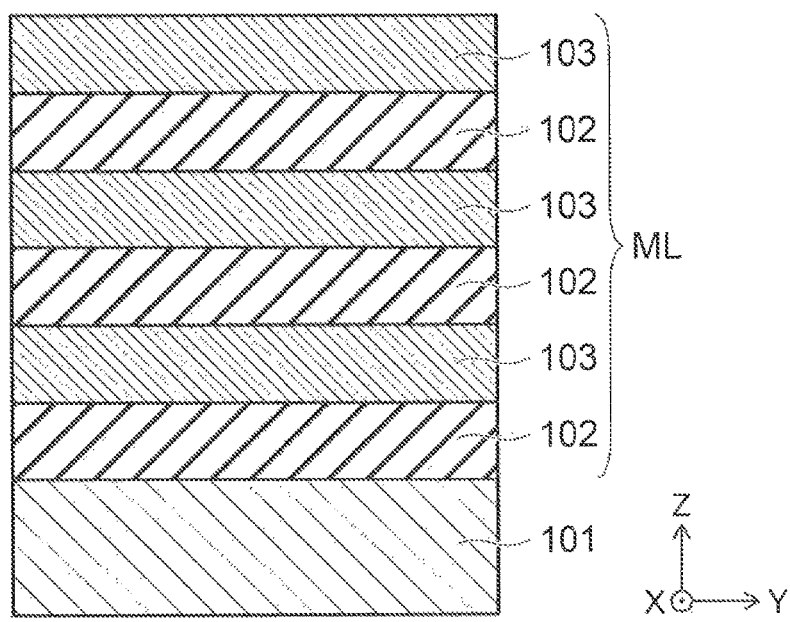

First, as shown in FIG. 3, the silicon substrate 101 made of silicon is prepared. Next, the inter-electrode insulating layers 102 and the electrode layers 103 are alternately stacked on the silicon substrate 101 by a sputtering method or a CVD (Chemical Vapor Deposition) method to thereby form the stacked body ML. The inter-electrode insulating layer 102 is formed of, for example, silicon oxide, and the electrode layer 103 is formed of, for example, a low-resistance metal such as tungsten (W) or molybdenum (Mo), or a metal silicide such as nickel silicide.

Figure 4:
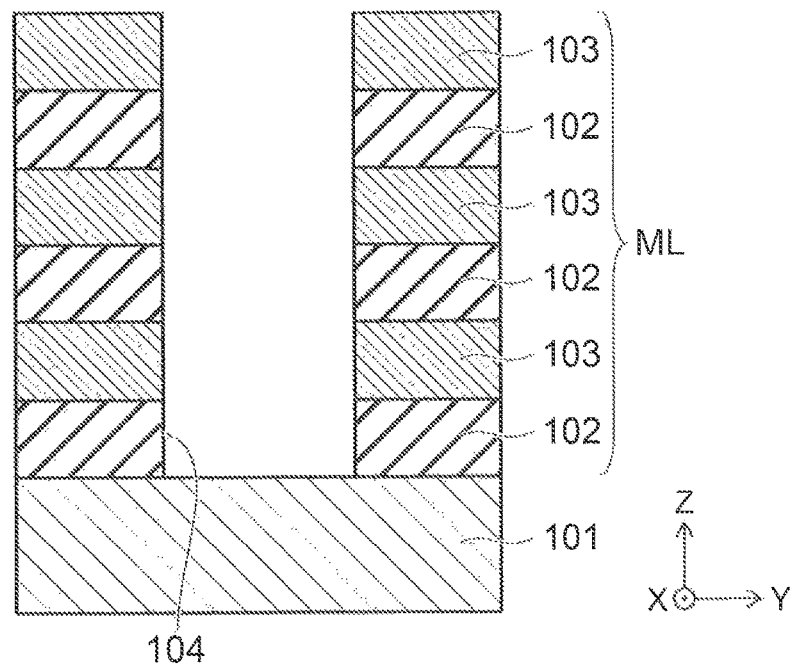

Next, as shown in FIG. 4, the memory hole 104 that penetrates the stacked body ML is formed by anisotropic etching such as RIE (Reactive Ion Etching). The silicon substrate 101 is exposed in a bottom surface of the memory hole 104.

Figure 5:
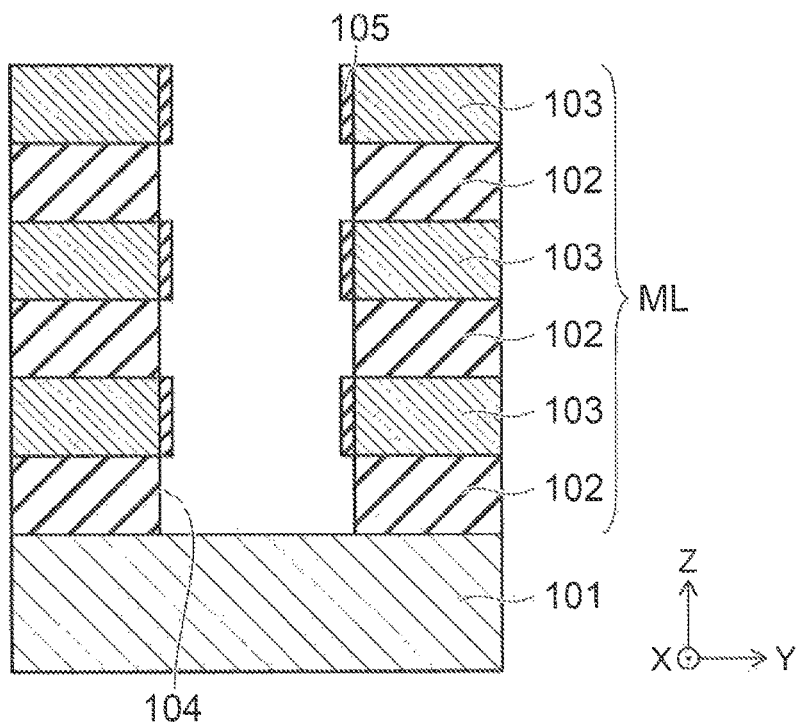

Next, as shown in FIG. 5, the electrode antioxidant layer 105 is selectively formed on the side surface of the electrode layer 103 in the memory hole 104 by an ALD method, a CVD method, an LP-CVD (Low Pressure Chemical Vapor Deposition) method, a plasma CVD method, or a sputtering method. For example, in the deposition of the electrode antioxidant layer 105 through ALD, the deposition rate of the electrode antioxidant layer 105 is higher on the side surface of the electrode layer 103 than on a side surface of the inter-electrode insulating layer 102. With the use of this phenomenon, the electrode antioxidant layer 105 can be selectively formed on the side surface of the electrode layer 103.

Figure 6:
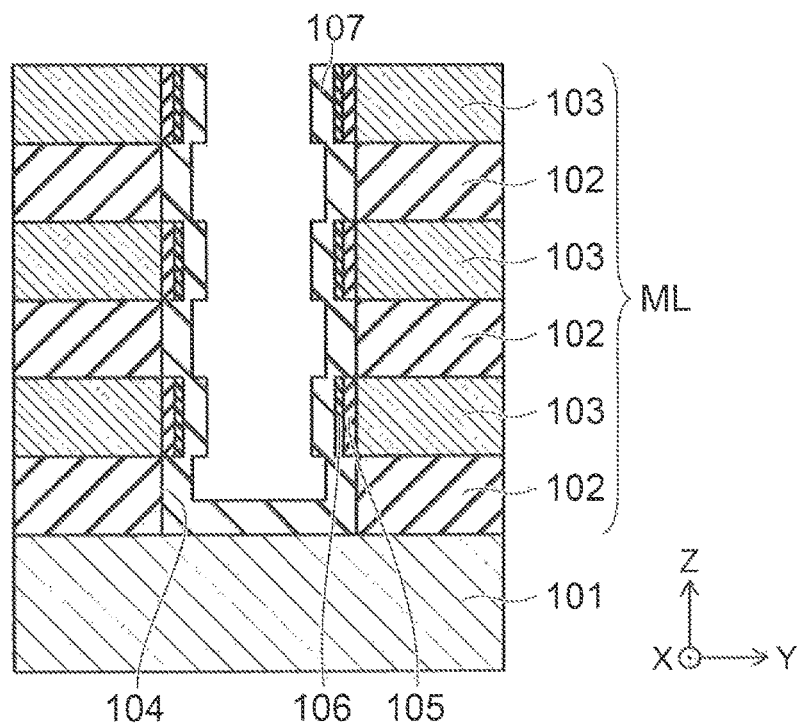

Next, as shown in FIG. 6, for example, a material containing a substance that is turned into a high dielectric constant metal oxide through oxidation is deposited in the memory hole 104 by applying an ALD method or a CVD method using an oxidizing reactant. The deposited material is oxidized by the oxidizing reactant. With this configuration, the charge block layer 107 that covers the side surface of the inter-electrode insulating layer 102 and the side surface of the electrode antioxidant layer 105 is formed. In this case, the charge block layer 107 is also formed on an upper surface of the stacked body ML (not shown). The charge block layer 107 is formed of, for example, a high dielectric constant metal oxide such as aluminum oxide, hafnium oxide, zirconium oxide, strontium oxide, titanium oxide, gadolinium oxide, yttrium oxide, erbium oxide, or scandium oxide. Moreover, at least a portion of the electrode antioxidant layer 105 is oxidized by exposure to the oxidizing reactant, so that the oxide layer 106 is formed between the electrode layer 103 and the charge block layer 107. As the oxidizing reactant, for example, ozone, water, oxygen, or an oxygen radical can be used.

Figure 7:
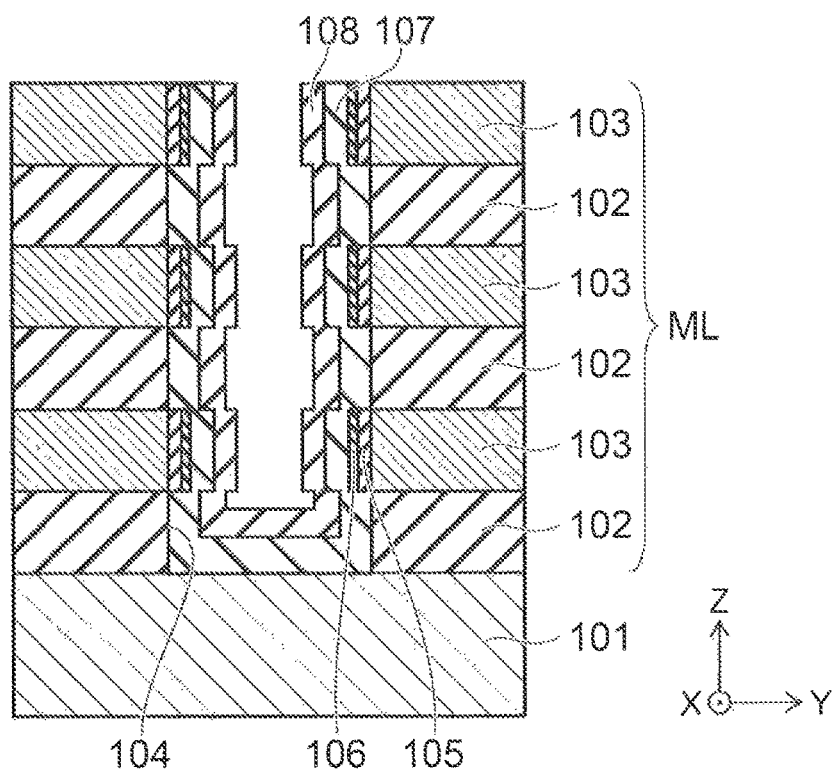

Next, as shown in FIG. 7, the charge storage layer 108 is formed on the charge block layer 107 by, for example, an ALD method or a CVD method.

Figure 8:
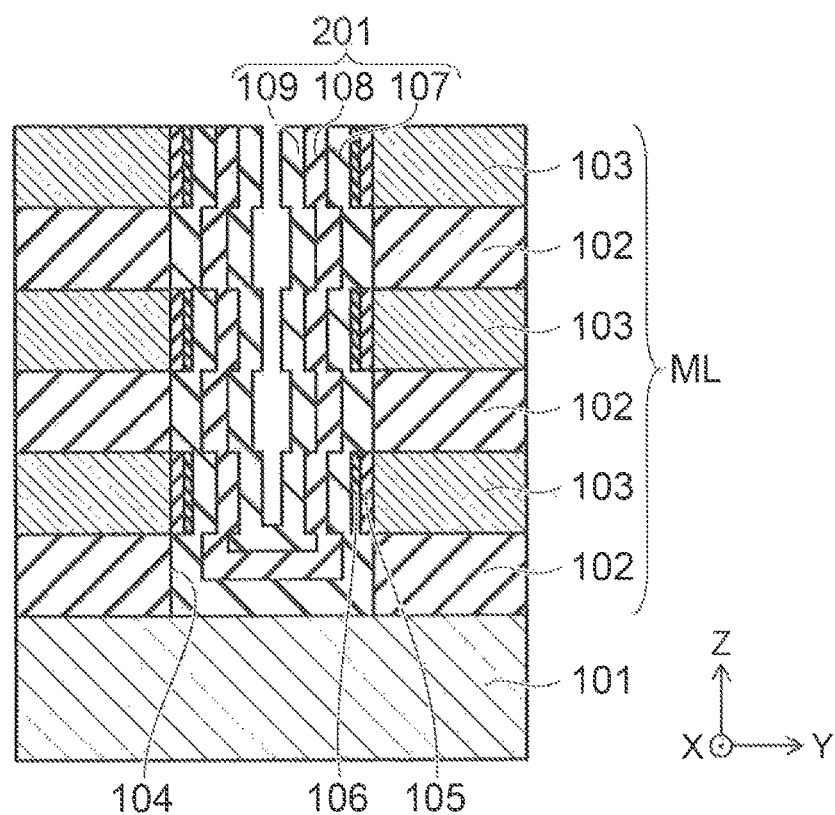

Next, as shown in FIG. 8, the tunnel insulating layer 109 is formed on the charge storage layer 108 by, for example, an ALD method or a CVD method. Thereafter, the charge block layer 107, the charge storage layer 108, and the tunnel insulating layer 109 that are formed on the upper surface of the stacked body ML are removed by a planarizing process such as a CMP method (not shown). In this case, the charge block layer 107, the charge storage layer 108, and the tunnel insulating layer 109 that are formed in the memory hole 104 remain therein.

Next, the charge block layer 107, the charge storage layer 108, and the tunnel insulating layer 109 that are formed on the bottom surface of the memory hole 104 are removed by anisotropic etching such as RIE. With this configuration, the silicon substrate 101 is exposed in the bottom surface of the memory hole 104.

Next, as shown in FIG. 2, amorphous silicon containing an impurity serving as a donor is embedded in the memory hole 104. In this case, the amorphous silicon contacts the silicon substrate 101. Next, for example, annealing is performed at a temperature of appropriately from 500 to 600° C., so that the amorphous silicon is crystallized with a portion thereof in contact with the silicon substrate 101 as a starting point. With this configuration, the silicon pillar 110 of n-type that is epitaxially grown from the silicon substrate 101 is formed in the memory hole 104.

In this case, since the crystallinity of silicon crystal that forms the silicon pillar 110 is inherited from the crystallinity of the silicon substrate 101, the silicon pillar 110 has good crystallinity with few crystal defects.

Thereafter, a common process is carried out to manufacture the semiconductor memory device 100 according to the embodiment.

Next, advantageous effects of the embodiment will be described.

In the semiconductor memory device 100 according to the embodiment, as shown in FIG. 5, the electrode antioxidant layer 105 is formed on the side surface of the electrode layer 103 in the memory hole 104. With this configuration, in the process for forming the charge block layer 107 by an ALD method in an oxidizing atmosphere shown in FIG. 6, oxidation of the electrode layer 103 can be suppressed. Hence, it is possible to suppress an increase in interconnection resistance caused by partial oxidation of the electrode layer 103. With this configuration, it is possible to prevent deterioration of the charge retention characteristics and memory characteristics such as writing/erasing characteristics of the semiconductor memory device 100.

The oxide layer 106 that is formed by the oxidation of the electrode antioxidant layer 105 functions as a charge block layer. Since the oxide layer 106 has a high dielectric constant, an electric field generated in the electrode layer 103 easily reaches the silicon pillar 110. In this case, volume expansion occurs with low density in the portion that is oxidized from the electrode antioxidant layer 105 and turned into the oxide layer 106. With this configuration, since irregularities of the oxide layer 106 are formed on the side surface of the electrode antioxidant layer 105, a structure in which electric field concentration is likely to occur is provided.

Further, the portion of the charge storage layer 108, which covers the electrode antioxidant layer 105, projects toward the inside of the memory hole 104 and is disposed in a bellows shape. For this reason, diffusion of trapped charge of the charge storage layer 108 in the Z-direction is suppressed. With this configuration, the data retention characteristics of the semiconductor memory device 100 are improved.

In the semiconductor memory device 100 according to the embodiment, the electrode antioxidant layer 105 may be a metal that is not oxidized in the process for forming the charge block layer 107, and may be formed of a metal such as, for example, platinum (Pt), gold (Au), or silver (Ag). In this case, the oxide layer 106 is not formed.

Second Embodiment

Next, a second embodiment will be described.

FIG. 10 is a cross-sectional view illustrating a semiconductor memory device according to the embodiment, showing a region corresponding to the portion A in FIG. 1.

As shown in FIG. 10, in the semiconductor memory device 200 according to the embodiment, a side surface of the electrode layer 103 on the memory hole 104 side is formed in a concave shape with respect to a side surface of the inter-electrode insulating layer 102 on the memory hole 104 side in the memory hole 104. That is, a concave portion 202 is formed at a portion of the electrode layer 103 including the side surface thereof on the memory hole 104 side. In the concave portion 202, upper and lower edges of the portion including the side surface of the electrode layer 103 are removed. The shape of the removed portion is, for example, a bird's beak shape. That is, in the concave portion 202 formed in the electrode layer 103, a thickness-direction central portion of the electrode layer 103 projects into the memory hole 104 with respect to the upper edge and the lower edge. The concave portion 202 is embedded in the electrode antioxidant layer 105. The oxide layer 106 is provided on a side surface of the electrode antioxidant layer 105 on the memory hole 104 side. In the memory hole 104, the charge block layer 107 that covers the side surfaces of the inter-electrode insulating layer 102, the electrode antioxidant layer 105, and the oxide layer 105, and the bottom surface of the memory hole 104 is provided. The charge storage layer 108 is provided on a surface of the charge block layer 107. Further, the tunnel insulating layer 109 is provided on a surface of the charge storage layer 108. The silicon pillar 110 is provided at a position including the central axis of the memory hole 104, and the silicon pillar 110 is in contact with the upper surface of the silicon substrate. The charge block layer 107, the charge storage layer 108, and the tunnel insulating layer 109 are provided vertically to the substrate along the side surface of the memory hole 104. That is, as viewed from the X-direction, the shape of the charge block layer 107, the charge storage layer 108, and the tunnel insulating layer 109 is not a bellows shape but is a linear shape. A distance between the electrode layer 103 and the silicon pillar 110 is longer than a distance between the inter-electrode insulating layer 102 and the silicon pillar 110.

The other configurations are the same as those of the semiconductor memory device 100 according to the first embodiment.

Next, a method for manufacturing the semiconductor memory device 200 according to the embodiment will be described.

FIG. 11 to FIG. 14 are process cross-sectional views illustrating the method for manufacturing the semiconductor memory device according to the second embodiment, showing a region corresponding to the portion A shown in FIG. 1.

First, the processes shown in FIG. 3 and FIG. 4 are carried out.

Figure 11:
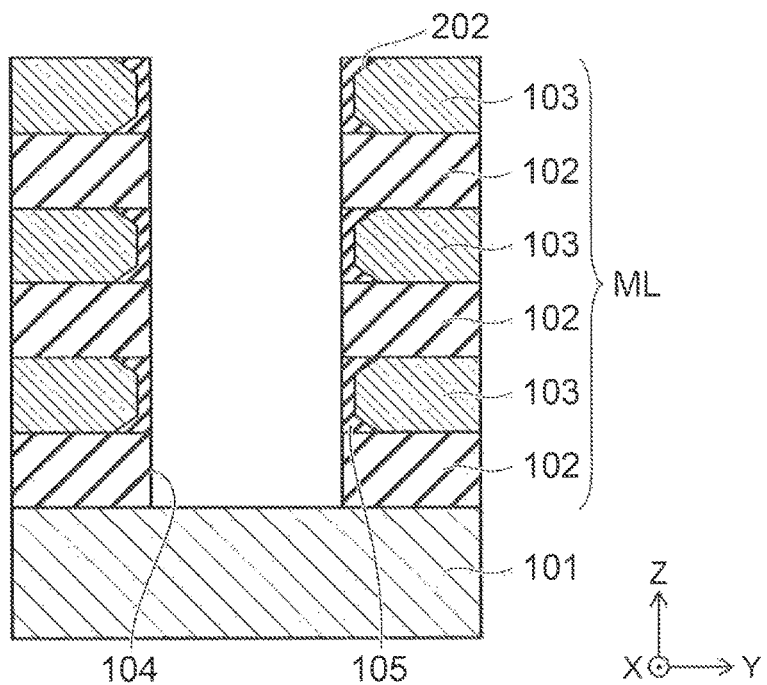
FIG. 11 to FIG. 14 are process cross-sectional views illustrating a method for manufacturing the semiconductor memory device according to the second embodiment, showing a region corresponding to the portion A shown in FIG. 1.

Next, as shown in FIG. 11, a portion of the electrode layer 103 including a surface thereof in the memory hole 104 is removed by applying wet etching. With this configuration, the removed portion of the electrode layer 103 serves as the concave portion 202. In the concave portion 202, the shape of the upper and lower edges of the portion including the side surface of the electrode layer 103 is, for example, a bird's beak shape. Thereafter, the electrode antioxidant layer 105 is selectively formed on the side surface of the electrode layer 103 in the memory hole 104 by a deposition technique such as an ALD method, a CVD method, an LP-CVD method, a plasma CVD method, or a sputtering method. With this configuration, the electrode antioxidant layer 105 is embedded in the concave portion 202.

Figure 12:
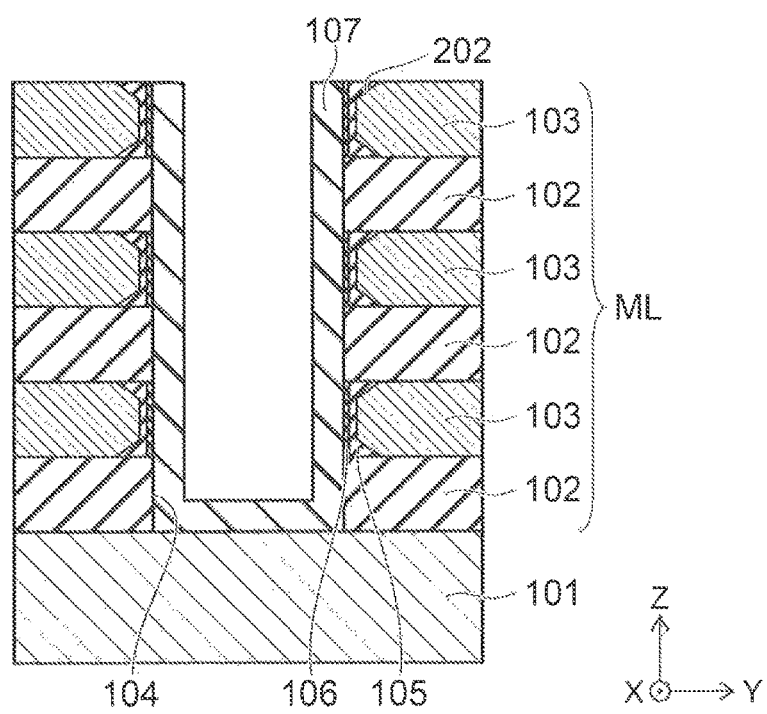
Figure 13:
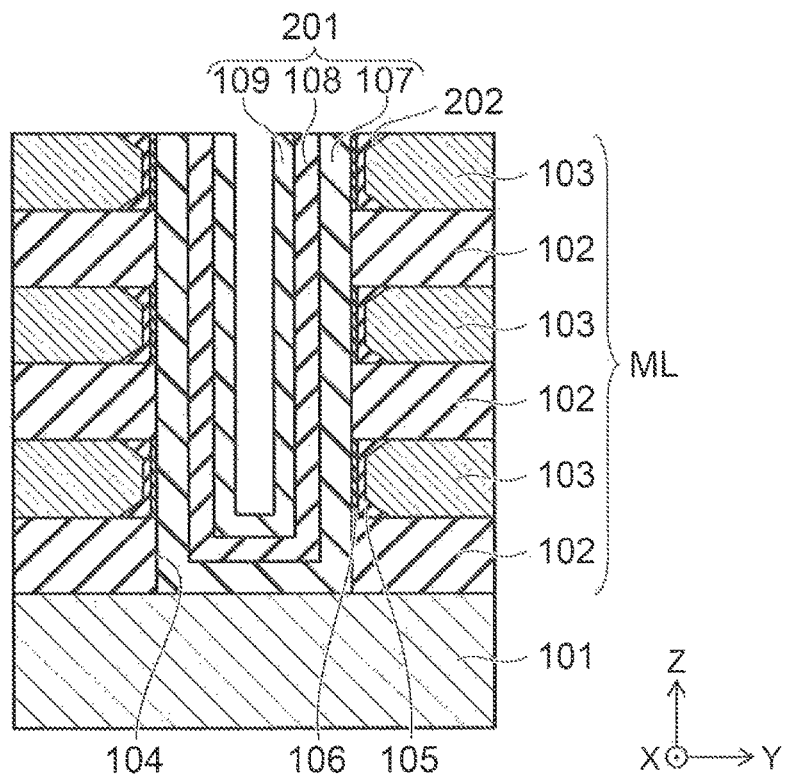
Figure 14:
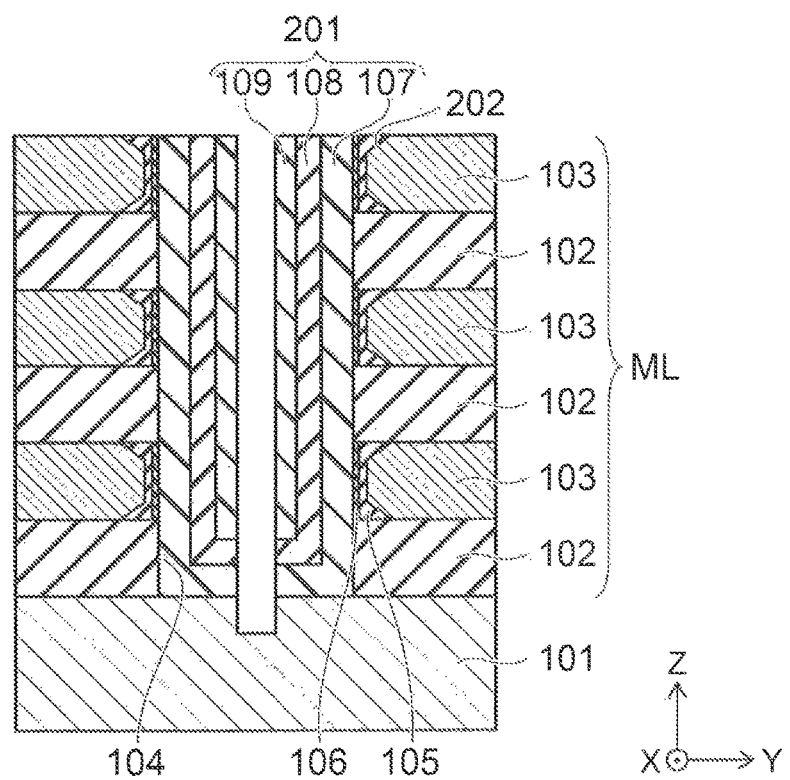

Next, as shown in FIG. 12, the charge block layer 107 that covers the side surface of the inter-electrode insulating layer 102 and the side surface of the electrode antioxidant layer 105 is formed in is the memory hole 104 by the same technique as that of the process of the first embodiment. In this case, the charge block layer 107 is also formed on the upper surface of the stacked body ML (not shown). In the embodiment, since the electrode antioxidant layer 105 does not project toward the inside of the memory hole 104, the charge block layer 107 is not formed in a bellows shape but is formed linearly as viewed from the X-direction. At least a portion of the electrode antioxidant layer 105 is oxidized by exposure to an oxidizing reactant, so that the oxide layer 106 is formed between the electrode layer 103 and the charge block layer. Then, as shown in FIG. 13, the charge storage layer 108 is formed on the charge block layer 107, and the tunnel insulating layer 109 is formed on the charge storage layer 108. In this case, the charge storage layer 108 and the tunnel insulating layer 109 are linearly formed as viewed from the X-direction because the electrode antioxidant layer 105 does not project toward the inside of the memory hole 104. Then, as shown in FIG. 14, the tunnel insulating layer 109, the charge storage layer 108, and the charge block layer 107 that are formed on the bottom surface of the memory hole 104 are removed by anisotropic etching such as RIE.

Thereafter, as shown in FIG. 10, the same process as that of the first embodiment is carried out to manufacture the semiconductor memory device 200 according to the embodiment.

Next, advantageous effects of the embodiment will be described.

In the semiconductor memory device 200 according to the embodiment, since the electrode antioxidant layer 105 is formed in a bird's beak shape, an electric field is concentrated at a portion of the electrode layer 103 between bird's beaks at two locations of the electrode antioxidant layer 105. Moreover, as viewed from the X-direction, the memory film 201 is provided not in a bellows shape but in a linear shape. With this configuration, compared to when the memory film 201 is formed in a bellows shape, the deposition properties of the memory film 201 are improved.

Advantageous effects of the embodiment other than those described above, which are the same as the advantageous effects of the first embodiment described above, are as follows. Since the electrode antioxidant layer 105 is formed, oxidation of the electrode layer 103 can be suppressed in the process for forming the charge block layer 107 by an ALD method in an oxidizing atmosphere. Hence, an increase in interconnection resistance can be suppressed.

Moreover, since the oxide layer 106 has a high dielectric constant, an electric field generated in the electrode layer 103 easily reaches the silicon pillar 110.

Third Embodiment

Next, a third embodiment will be described.

Figure 15:
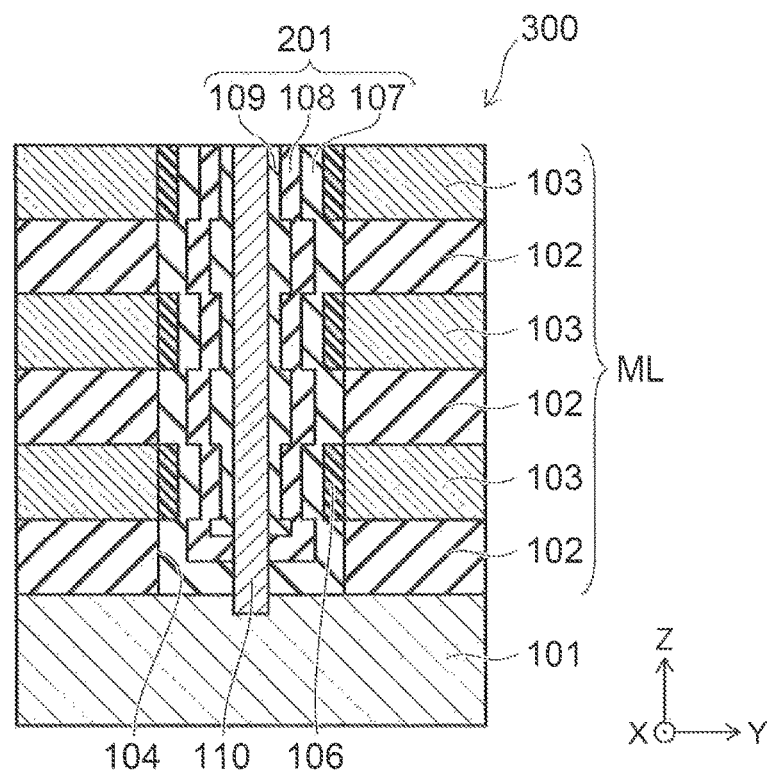
FIG. 15 is a cross-sectional view illustrating a semiconductor memory device according to a third embodiment, showing a region corresponding to the portion A in FIG. 1.

FIG. 15 is a cross-sectional view illustrating a semiconductor memory device according to the embodiment, showing a region corresponding to the portion A in FIG. 1.

As shown in FIG. 15, the semiconductor memory device 300 according to the embodiment is provided with the oxide layer 106 on a side surface of the electrode layer 103 in the memory hole 104, but is not provided with the electrode antioxidant layer 105. The other configurations are the same as those of the semiconductor memory device 100 according to the first embodiment.

In a method for manufacturing the semiconductor memory device 300 according to the embodiment, first, the processes shown in FIG. 3 to FIG. 5 are carried out in the same manner as in the first embodiment. Thereafter, in the process for forming the charge block layer 107 shown in FIG. 6, the electrode antioxidant layer 105 is substantially completely oxidized. With this configuration, the oxide layer 106 is formed on the side surface of the electrode layer 103 in the memory hole 104. In subsequent processes, the same processes as those of the first embodiment are carried out, so that the semiconductor memory device 300 according to the embodiment is manufactured.

In the semiconductor memory device 300 according to the embodiment, the electrode antioxidant layer 105 is formed on the side surface of the electrode layer 103 in the memory hole 104 in the same manner as the advantageous effect of the first embodiment. With this configuration, in the process for forming the charge block layer 107 by an ALD method in an oxidizing atmosphere, oxidation of the electrode layer 103 can be suppressed. Hence, an increase in interconnection resistance can be suppressed.

Moreover, since the oxide layer 106 has a high dielectric constant, an electric field generated in the electrode layer 103 easily reaches the silicon pillar 110.

Further, a portion of the charge storage layer 108, which covers the oxide layer 106, projects toward the inside of the memory hole 104 and is disposed in a bellows shape. For this reason, diffusion of trapped charge of the charge storage layer 108 in the Z-direction is suppressed.

Fourth Embodiment

Next, a fourth embodiment will be described.

Figure 16:
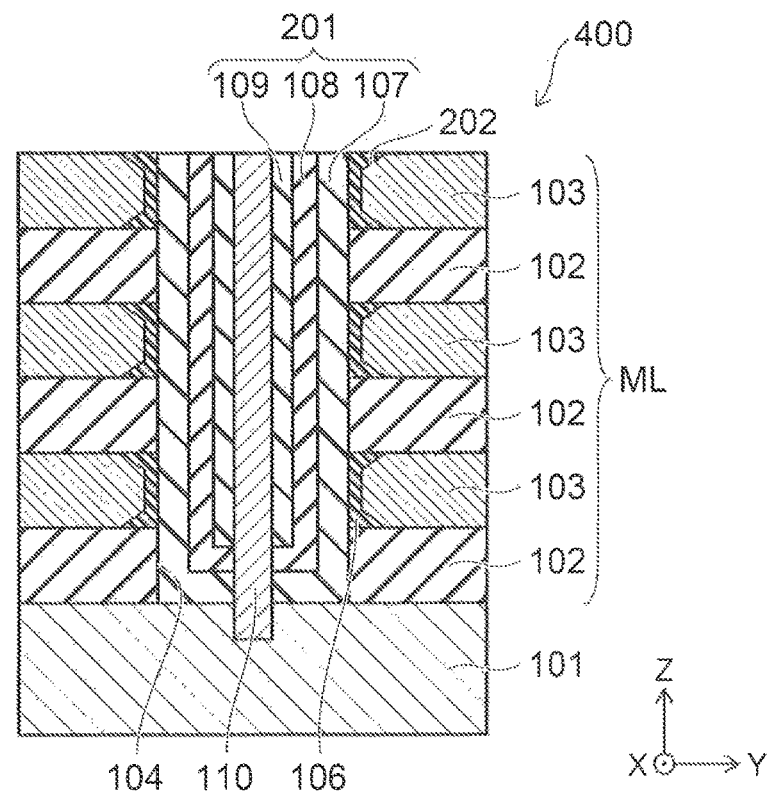
FIG. 16 is a cross-sectional view illustrating a semiconductor memory device according to a fourth embodiment, showing a region corresponding to the portion A in FIG. 1.

FIG. 16 is a cross-sectional view illustrating a semiconductor memory device according to the embodiment, showing a region corresponding to the portion A in FIG. 1.

As shown in FIG. 16, in the semiconductor memory device 400 according to the embodiment, a side surface of the electrode layer 103 on the memory hole 104 side is formed in a concave shape with respect to a side surface of the inter-electrode insulating layer 102 on the memory hole 104 side in the memory hole 104. That is, the concave portion 202 is formed on the memory hole 104 side of the electrode layer 103. In the concave portion 202, the upper and lower edges of the portion including the side surface of the electrode layer 103 are removed. The shape of the removed portion is, for example, a bird's beak shape. The electrode antioxidant layer 105 is not provided, and the oxide layer 106 is embedded in the concave portion 202. Configurations other than those described above are the same as those of the second embodiment. A distance between the electrode layer 103 and the silicon pillar 110 is longer than a distance between the inter-electrode insulating layer 102 and the silicon pillar 110.

In a method for manufacturing the semiconductor memory device 400 according to the embodiment, first, the processes shown in up to FIG. 11 are carried out in the same manner as in the second embodiment. Thereafter, in the process for forming the charge block layer 107 shown in FIG. 12, the electrode antioxidant layer 105 is substantially completely oxidized. With this configuration, the oxide layer 106 is formed on the side surface of the electrode layer 103 in the memory hole 104. In subsequent processes, the same processes as those of the second embodiment are carried out, so that the semiconductor memory device 400 according to the embodiment is manufactured.

In the semiconductor memory device 400 according to the embodiment, since the oxide layer 106 is formed in a bird's beak shape, an electric field is concentrated at a region between bird's beaks at two locations of the oxide layer 106 in the electrode layer 103.

Advantageous effects of the embodiment other than those described above, which are the same as the advantageous effects of the second embodiment described above, are as follows. Since the electrode antioxidant layer 105 is formed, oxidation of the electrode layer 103 can be suppressed in the process for forming the charge block layer 107 by an ALD method in an oxidizing atmosphere. Hence, an increase in interconnection resistance can be suppressed. The electrode antioxidant layer 105 is turned into the oxide layer 106 through oxidation. For this reason, the electrode antioxidant layer 105 does not remain in an end product.

Moreover, as viewed from the X-direction, the memory film 201 is provided not in a bellows shape but in a linear shape. With this configuration, compared to when the memory film 201 is formed in a bellows shape, the deposition properties of the memory film 201 are improved.

Fifth Embodiment

Next, a fifth embodiment will be described.

Figure 17:
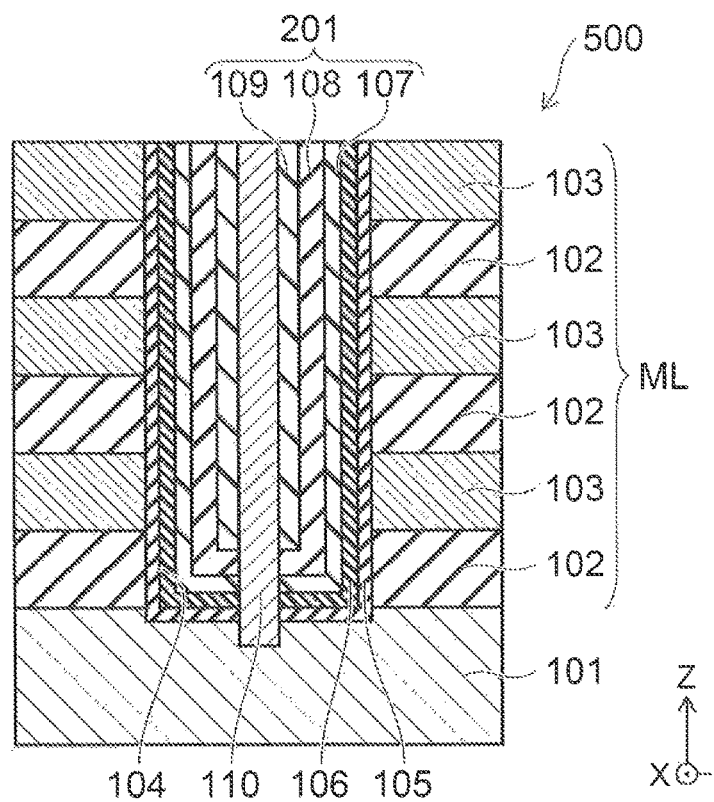
FIG. 17 is a cross-sectional view illustrating a semiconductor memory device according to a fifth embodiment, showing a region corresponding to the portion A in FIG. 1.

FIG. 17 is a cross-sectional view illustrating a semiconductor memory device according to the embodiment, showing a region corresponding to the portion A in FIG. 1.

As shown in FIG. 17, in the semiconductor memory device 500 according to the embodiment, the electrode antioxidant layer 105 is provided so as to cover an entire inner surface of the memory hole 104.

The electrode antioxidant layer 105 is formed of a material that has a higher resistance than that of the electrode layer 103 and is turned into a high dielectric constant metal oxide through oxidation. For example, the electrode antioxidant layer 105 is formed of one or more kinds of materials selected from the group consisted of hafnium, zirconium, aluminum, hafnium nitride, zirconium nitride, aluminum nitride, hafnium carbide, zirconium carbide, and aluminum carbide.

The oxide layer 106 is provided on the electrode antioxidant layer 105, and the memory film 201 is provided on the oxide layer 106. The memory film 201 is provided not in a bellows shape but in a linear shape as viewed from the X-direction. The other configurations are the same as those of the semiconductor memory device 100 according to the first embodiment.

In a method for manufacturing the semiconductor memory device 500 according to the embodiment, first, the processes shown in FIG. 3 and FIG. 4 are carried out in the same manner as in the first embodiment. Next, the electrode antioxidant layer 105 that covers the entire inner surface of the memory hole 104 is formed. Next, the charge block layer 107 that covers the side surface of the electrode antioxidant layer 105 is formed in the memory hole 104 by, for example, applying an ALD method or a CVD method using an oxidizing reactant. A portion of the electrode antioxidant layer 105 is oxidized by exposure to the oxidizing reactant, so that the oxide layer 106 is formed between the inner surface of the memory hole 104 and the charge block layer 107. In subsequent processes, the same processes as those of the first embodiment are carried out, so that the semiconductor memory device 500 according to the embodiment is manufactured.

In the semiconductor memory device 500 according to the embodiment, the electrode antioxidant layer 105 is linearly provided as viewed from the X-direction. In this case, since the electrode antioxidant layer 105 is formed to cover the entire inner surface of the memory hole, the deposition properties of the electrode antioxidant layer 105 are better than those obtained when the electrode antioxidant layer 105 is formed only on the side surface of the electrode layer 103.

Advantageous effects of the embodiment other than those described above, which are the same as the advantageous effects of the second embodiment described above, are as follows. The memory film 201 is provided not in a bellows shape but in a linear shape as viewed from the X-direction. With this configuration, compared to when the memory film 201 is formed in a bellows shape, the deposition properties of the memory film 201 are improved.

Moreover, since the electrode antioxidant layer 105 is formed on the side surface of the electrode layer, oxidation of the electrode layer 103 can be suppressed in the process for forming the charge block layer 107 by an ALD method in an oxidizing atmosphere. Hence, an increase in interconnection resistance can be suppressed.

Sixth Embodiment

Next, a sixth embodiment will be described.

Figure 18:
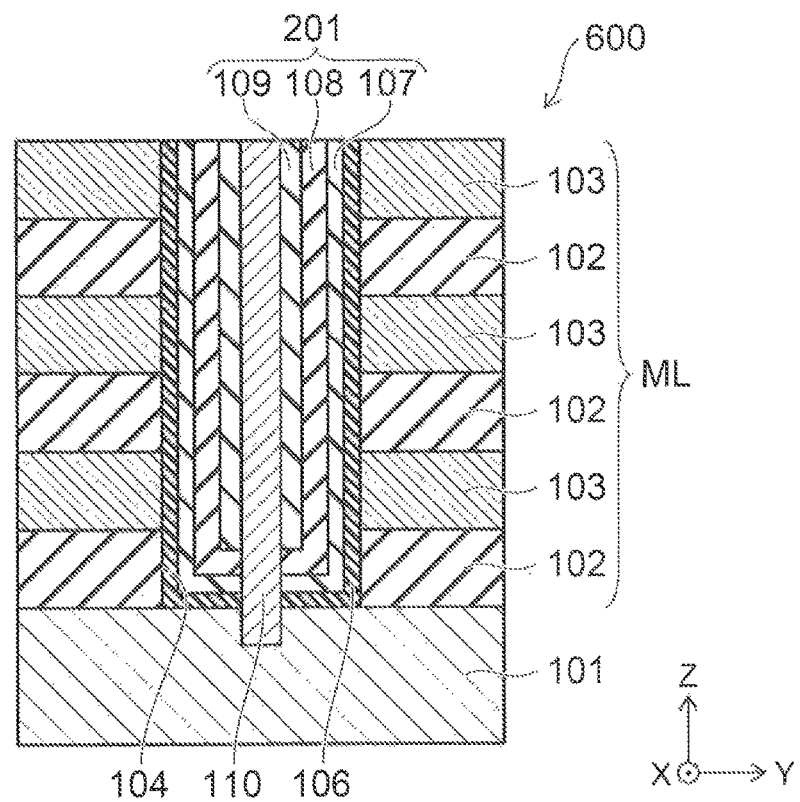
FIG. 18 is a cross-sectional view illustrating a semiconductor memory device according to a sixth embodiment, showing a region corresponding to the portion A in FIG. 1.

FIG. 18 is a cross-sectional view illustrating a semiconductor memory device according to the embodiment, showing a region corresponding to the portion A in FIG. 1.

As shown in FIG. 18, in the semiconductor memory device 600 according to the embodiment, the oxide layer 106 is provided so as to cover an entire inner surface of the memory hole 104. The memory film 201 is provided on the oxide layer 106. The memory film 201 is provided not in a bellows shape but in a linear shape as viewed from the X-direction. The electrode antioxidant layer 105 is substantially entirely oxidized and provided as the oxide layer 106. The other configurations are the same as those of the semiconductor memory device 100 according to the first embodiment.

In a method for manufacturing the semiconductor memory device 600 according to the embodiment, first, the processes shown in FIG. 3 and FIG. 4 are carried out in the same manner as in the first embodiment. Next, the electrode antioxidant layer 105 is formed so as to cover the entire inner surface of the memory hole 104. Next, the charge block layer 107 that covers the side surface of the electrode antioxidant layer 105 is formed in the memory hole 104 by, for example, applying an ALD method or a CVD method using an oxidizing reactant. In this case, the electrode antioxidant layer 105 is substantially entirely oxidized by exposure to the oxidizing reactant, so that the oxide layer 106 is formed between the electrode layer 103 and the charge block layer 107. In subsequent processes, the same processes as those of the first embodiment are carried out, so that the semiconductor memory device 600 according to the embodiment is manufactured.

In the semiconductor memory device 600 according to the embodiment, the oxide layer 106 is linearly provided as viewed from the X-direction. In this case, since the electrode antioxidant layer 105 is formed to cover the entire inner surface of the memory hole, the deposition properties of the electrode antioxidant layer 105 are better than those obtained when the electrode antioxidant layer 105 is formed only on the side surface of the electrode layer 103.

Advantageous effects of the embodiment other than those described above, which are the same as the advantageous effects of the second embodiment described above, are as follows. The memory film 201 is provided not in a bellows shape but in a linear shape as viewed from the X-direction. With this configuration, compared to when the memory film 201 is formed in a bellows shape, the deposition properties of the memory film 201 are improved.

Moreover, since the electrode antioxidant layer 105 is formed on the side surface of the electrode layer 103, oxidation of the electrode layer 103 can be suppressed in the process for forming the charge block layer 107 by an ALD method in an oxidizing atmosphere. Hence, an increase in interconnection resistance can be suppressed.

According to the embodiments described above, it is possible to realize a semiconductor memory device having stable memory characteristics and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
   a stacked body including a plurality of electrode layers stacked separated from each other and an inter-electrode insulating layer between the electrode layers;
   a semiconductor member extending in a stacking direction of the stacked body and penetrating the stacked body;
   a tunnel insulating layer provided on a side surface of the semiconductor member;
   a charge storage layer provided on a side surface of the tunnel insulating layer;
   a charge block layer provided on a side surface of the charge storage layer and containing oxygen; and
   an electrode antioxidant layer provided between the charge block layer and the electrode layer and having a composition different from that of the electrode layer,
   wherein as viewed from a direction vertical to the stacking direction, the charge storage layer and the charge block layer that are stacked in a direction of the semiconductor member on a side surface side of the electrode antioxidant layer project in a direction of the tunnel insulating layer beyond the charge storage layer and the charge block layer that are stacked in the direction of the semiconductor member on a side surface side of the inter-electrode insulating layer.

2. The device according to claim 1, further comprising an oxide layer provided at least a portion between the electrode antioxidant layer and the charge block layer and containing an oxide of a same material as that forming the electrode antioxidant layer.

3. The device according to claim 2, wherein the oxide layer is formed of a material containing a high dielectric constant metal oxide.

4. The device according to claim 1, wherein the electrode antioxidant layer is formed of a conductive material.

5. The device according to claim 1, wherein the electrode antioxidant layer contains one or more kinds of materials selected from the group consisting of hafnium, zirconium, aluminum, hafnium nitride, zirconium nitride, aluminum nitride, hafnium carbide, zirconium carbide, and aluminum carbide.

6. The device according to claim 1, wherein the electrode antioxidant layer is not provided on a side surface of the inter-electrode insulating layer.

7. A semiconductor memory device comprising:
   a stacked body including a plurality of electrode layers stacked separated from each other and an inter-electrode insulating layer between the electrode layers;
   a semiconductor member extending in a stacking direction of the stacked body and penetrating the stacked body;
   a tunnel insulating layer provided on a side surface of the semiconductor member;
   a charge storage layer provided on a side surface of the tunnel insulating layer;
   a charge block layer provided on a side surface of the charge storage layer and containing oxygen; and
   an oxide layer provided between the charge block layer and the electrode layer, the oxide layer containing one or more kinds of materials selected from the group consisting of hafnium oxide, zirconium oxide, and aluminum oxide,
   wherein as viewed from a direction vertical to the stacking direction, the charge storage layer and the charge block layer that are stacked in a direction of the semiconductor member on a side surface side of the oxide layer project in a direction of the tunnel insulating layer beyond the charge storage layer and the charge block layer that are stacked in the direction of the semiconductor member on a side surface side of the inter-electrode insulating layer.

8. The device according to claim 7, wherein a shape of the charge storage layer and the charge block layer is a bellows shape as viewed from a direction vertical to the stacking direction.

9. The device according to claim 7, wherein the oxide layer is not provided on a side surface of the inter-electrode insulating layer on the semiconductor member side.

* * * * *